(12) United States Patent
Kondo

(10) Patent No.: US 9,013,900 B2
(45) Date of Patent: Apr. 21, 2015

(54) NOISE REDUCTION UNIT, POWER SUPPLY DEVICE, AND METHOD FOR DISPOSING CORES IN NOISE REDUCTION UNIT

(71) Applicant: Koichi Kondo, Nisshin (JP)

(72) Inventor: Koichi Kondo, Nisshin (JP)

(73) Assignee: Brother Kogyo Kabushiki Kaisha, Nagoya-shi, Aichi-ken (JP)

( * ) Notice: Subject to any disclaimer, the term of this patent is extended or adjusted under 35 U.S.C. 154(b) by 161 days.

(21) Appl. No.: 13/852,893

(22) Filed: Mar. 28, 2013

(65) Prior Publication Data

US 2013/0322134 A1   Dec. 5, 2013

(30) Foreign Application Priority Data

May 31, 2012   (JP) .................. 2012-124285

(51) Int. Cl.
| | |
|---|---|
| *H02M 1/12* | (2006.01) |
| *H02M 1/14* | (2006.01) |
| *H03H 7/01* | (2006.01) |
| *H03H 1/00* | (2006.01) |
| *H01F 17/06* | (2006.01) |
| *H02M 1/42* | (2007.01) |

(52) U.S. Cl.
CPC ............ *H02M 1/126* (2013.01); *H03H 7/0138* (2013.01); *H03H 1/0007* (2013.01); *H03H 2001/0035* (2013.01); *H03H 2001/0092* (2013.01); *H02M 1/4258* (2013.01); *H01F 17/062* (2013.01); *Y02B 70/126* (2013.01)

(58) Field of Classification Search
USPC ............................................ 363/39; 333/177
See application file for complete search history.

(56) References Cited

U.S. PATENT DOCUMENTS

| | | | | |
|---|---|---|---|---|
| 5,587,694 | A * | 12/1996 | Minato et al. ................... | 336/65 |
| 6,014,071 | A * | 1/2000 | Onishi et al. .................. | 336/170 |
| 6,016,095 | A * | 1/2000 | Herbert ......................... | 336/175 |
| 6,608,544 | B2 * | 8/2003 | Yoshioka et al. .............. | 336/184 |
| 6,628,191 | B1 * | 9/2003 | Wobben ........................ | 336/234 |
| 6,992,555 | B2 * | 1/2006 | Hasegawa et al. ............ | 336/178 |
| 7,768,369 | B2 * | 8/2010 | Park ............................ | 336/84 C |
| 2002/0003713 | A1 * | 1/2002 | Nakawaga ...................... | 363/72 |
| 2012/0326822 | A1 * | 12/2012 | Yokota ........................... | 336/67 |

FOREIGN PATENT DOCUMENTS

| | | |
|---|---|---|
| JP | H01-124726 U | 8/1989 |
| JP | 2001-298952 A | 10/2001 |
| JP | 2011-192825 A | 9/2011 |
| JP | 2012-019504 A | 1/2012 |

* cited by examiner

*Primary Examiner* — Emily P Pham
(74) *Attorney, Agent, or Firm* — Baker Botts L.L.P.

(57) ABSTRACT

A noise reduction unit includes a plurality of cores each having formed therein a through hole, a plurality of wires connected to a noise source and each wound around the corresponding core through the through hole, and a core supporting member that supports the plurality of cores. The core supporting member supports the plurality of cores in such a manner that the plurality of cores is disposed parallel to each other along a through direction of the through holes and spaced apart from each other with a predetermined gap in the through direction.

10 Claims, 8 Drawing Sheets

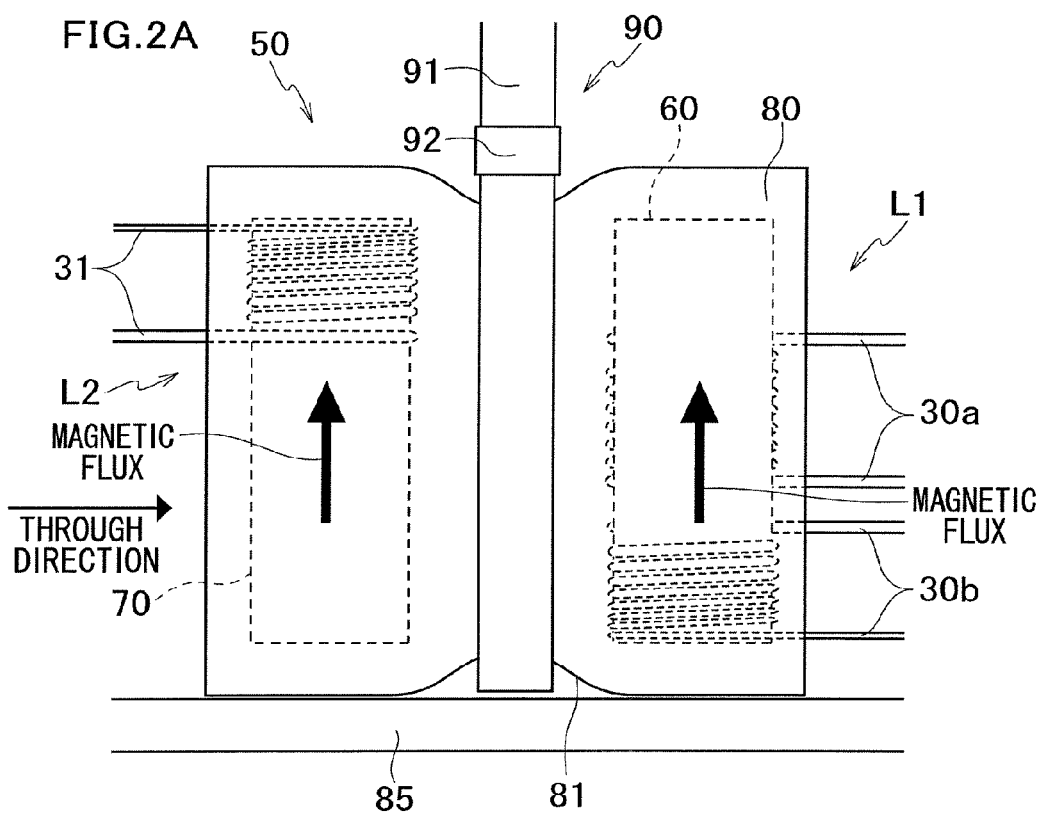
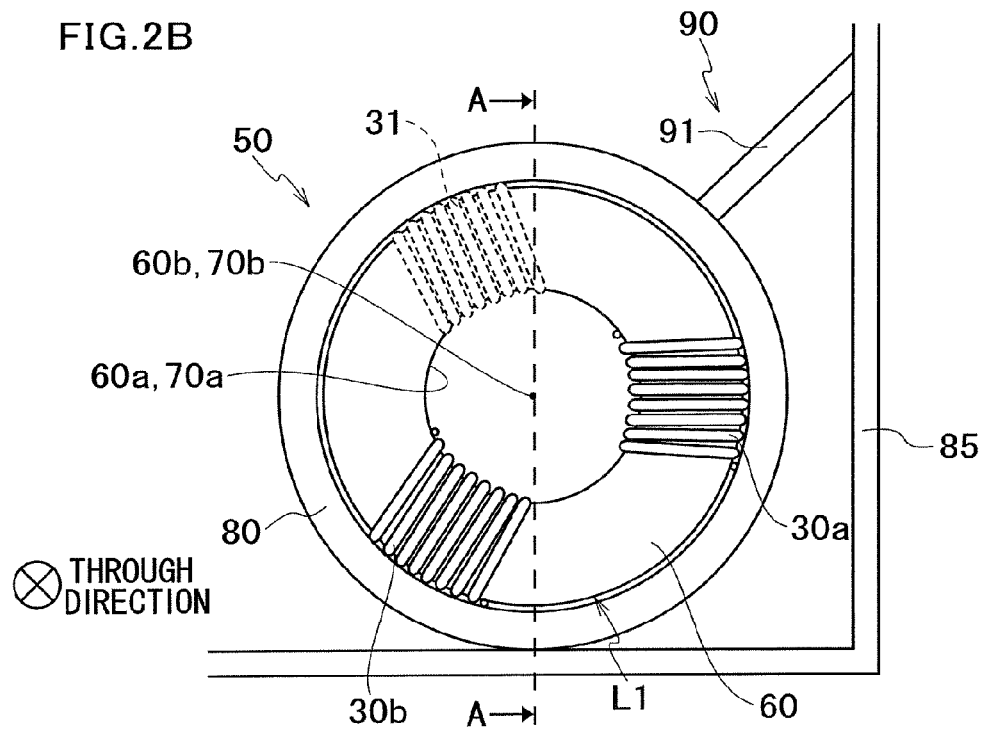

NOISE REDUCTION UNIT, POWER SUPPLY DEVICE, AND METHOD FOR DISPOSING CORES IN NOISE REDUCTION UNIT

CROSS REFERENCE TO RELATED APPLICATION

The present application claims priority from Japanese Patent Application No. 2012-124285, which was filed on May 31, 2012, the disclosure of which is herein incorporated by reference in its entirety.

BACKGROUND OF THE INVENTION

1. Field of the Invention

The present invention relates to a noise reduction unit that includes a plurality of cores for noise filters, a power supply device that includes the noise reduction unit, and a method for disposing cores in the noise reduction unit.

2. Description of Related Art

A power supply device is known that supplies power from an (external) power supply to a load such as an electrical device. A switching power supply circuit is known in which the input alternating current through a power input terminal is output as direct current via a rectifying section and a plurality of DC-DC converters to obtain a plurality of direct current outputs. There is also a technique by which the noise generated in a DC-DC converter and conducted through a power line is reduced with a noise reduction unit (common-mode filter) provided between a power input terminal and a rectifying section in a power supply device.

SUMMARY OF THE INVENTION

The frame of a power supply device is typically provided with a frame grounding wire to ensure safety (prevention of electric shock). Some power supply devices are further provided with a noise filter (normal-mode filter) for the purpose of reducing the noise conducted through the frame grounding wire, because the noise in the power supply device may leak into external peripherals or other such devices via the frame grounding wire. In some cases, the noise filter is provided for each output line of the direct current output from the power supply device, because these output lines are likely to conduct different forms of noise. Such noise filters are often configured from a wire wound around a magnetic core of material such as metal oxide. The filers using the core have a simple structure, and are advantageous in terms of design freedom. A drawback, however, is the relatively large number of components it requires. Thus, using a plurality of cores requires some ingenuity for the downsizing of the noise reduction unit to be provided with the multiple cores.

The inventors of the present application conducted intensive studies to downsize the noise reduction unit that includes a plurality of cores, and found that the noise reduction effects of the cores disposed close to each other deteriorate in a manner that depends on the placement or positions of the cores.

According to an aspect of the present invention, there are provided a noise reduction unit that can be downsized without deteriorating the noise reduction effect, a power supply device that includes the noise reduction unit, and a method for disposing cores in the noise reduction unit.

A noise reduction unit according to an embodiment of the present invention includes a plurality of cores, a plurality of wires, and a core supporting member. The cores each have formed therein a through hole. The wires are connected to a noise source and each wound around the corresponding core through the through hole. The core supporting member supports the plurality of cores. The core supporting member supports the plurality of cores in such a manner that the plurality of cores is disposed parallel to each other along a through direction of the through holes and spaced apart from each other with a predetermined gap in the through direction.

A power supply device of an embodiment of the present invention includes: a noise reduction unit, a plurality of power input terminals, a power conversion circuit, a plurality of power lines, and a frame grounding wire. The power input terminals are configured to receive the externally input power. The power conversion circuit is configured to convert the input power through the plurality of power input terminals into a predetermined power, and output the converted predetermined power. The power lines connect the plurality of power input terminals to a plurality of input terminals of the power conversion circuit. The frame grounding wire connects a ground terminal in the plurality of power input terminals to a frame configured to protect the power conversion circuit. The noise reduction unit includes a plurality of cores, a plurality of wires, and a core supporting member. The cores each have formed therein a through hole. The wires are connected to a noise source and each wound around the corresponding core through the through hole. The core supporting member supports the plurality of cores. The core supporting member supports the plurality of cores in such a manner that the plurality of cores is disposed parallel to each other along a through direction of the through holes and spaced apart from each other with a predetermined gap in the through direction. The noise source is the power conversion circuit. At least one of the plurality of power lines is used as the wires of the noise reduction unit and wound around at least one first core selected from the plurality of cores. The frame grounding wire is used as one of the wires of the noise reduction unit and wound around at least one second core different from the first core and selected, from the plurality of cores.

A power supply device according to an embodiment of the present invention is one that supplies an externally input power to a load with the foregoing noise reduction unit. The power supply device includes a plurality of power input terminals, a plurality of power conversion circuits, and a plurality of output lines. The power input terminals are configured to receive the externally input power. The power conversion circuits are connected in parallel with respect to the plurality of power input terminals, and configured to convert the input power through the plurality of power input terminals into different predetermined powers. The output lines connect a plurality of output terminals of the plurality of power conversion circuits to the load. The noise source is the plurality of power conversion circuits. The plurality of output lines are used as the wires of the noise reduction unit and wound around different cores of the plurality of cores.

A method for disposing cores in a noise reduction unit according to an embodiment of the present invention is a method for disposing cores in a noise reduction unit that includes a plurality of cores each having formed therein a through hole, and a plurality of wires connected to a Boise source and each wound around the corresponding core through the through hole. The method includes the step of disposing the plurality of cores in such a manner that the plurality of cores is disposed parallel to each other along a through direction of the through holes and spaced apart from each other with a predetermined gap in the through direction.

BRIEF DESCRIPTION OF THE DRAWINGS

Other and further objects, features and advantages of the invention will appear more fully from the following description taken in connection with the accompanying drawings in which:

FIG. 2A is a side view of the noise reduction unit of FIG. 1 as viewed from a direction orthogonal to the through direction of through holes of cores;

FIG. 2B is a plan view of the noise reduction unit of FIG. 1 as viewed from the through direction of the through holes of the cores;

DESCRIPTION OF THE PREFERRED EMBODIMENTS

First Embodiment

A power supply device according to First Embodiment of the present invention is described below with reference to the accompanying drawings.

Figure 1:
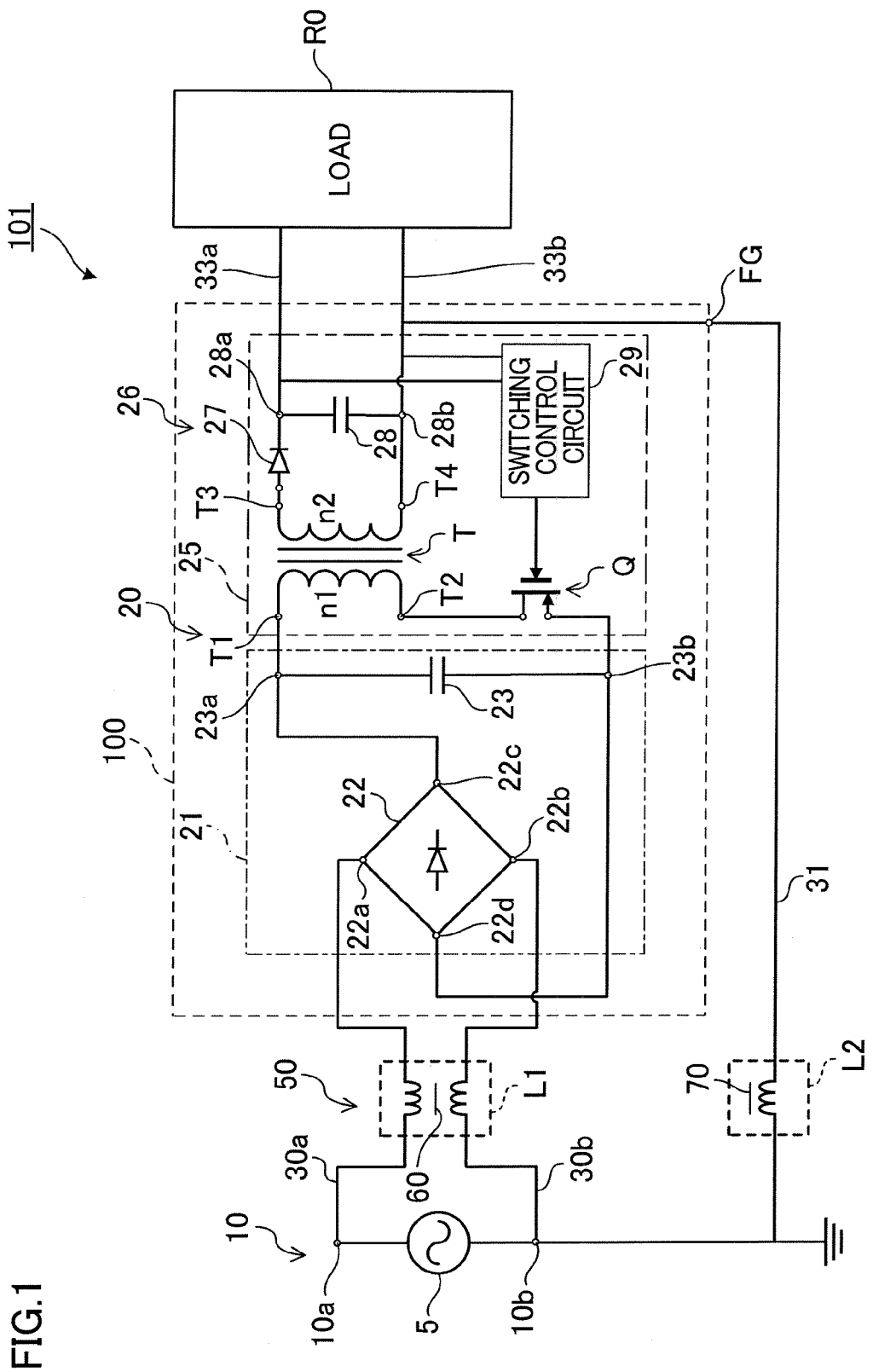
FIG. 1 is a circuit diagram of a power supply device according to First Embodiment of the present invention.

Referring to FIG. 1, the overall structure of a power supply device 101 is described first. The power supply device 101 includes a power input section 10, an AC-DC conversion circuit 20, a protective frame 100, and a noise reduction unit 50.

The power input section 10 includes two external input terminals 10a and 10b. The input primary alternating-current power from an alternating-current source 5 is applied between the external input terminals 10a and 10b. The external input terminal 10b ground terminal 10b) is connected to earth (grounded to the earth). The external input terminals 10a and 10b of the present embodiment correspond to power input terminals.

The AC-DC conversion circuit 20 converts the input primary alternating-current power through the power input section 10 into a predetermined secondary direct-current power, and supplies the secondary direct-current power to a load R0 of an electrical device or the like. The protective frame 100 is made of, for example, metallic material and houses and protects the AC-DC conversion circuit 20 inside. The frame ground FG of the protective frame 100 and the ground terminal 10b are connected to each other by a frame grounding wire 31 via earth. The noise reduction unit 50 reduces the noise generated in the AC-DC conversion circuit 20. The AC-DC conversion circuit 20 of the present embodiment corresponds to a power conversion circuit.

The AC-DC conversion circuit 20 is described below. The AC-DC conversion circuit 20 includes a primary rectifying circuit 21 that converts the primary alternating-current power into a primary direct-current power, and a DC-DC converter 25 that converts the primary direct-current power into the predetermined secondary direct-current power.

The primary rectifying circuit 21 includes a bridge rectifying circuit 22 (full-wave rectifying circuit), undo smoothing capacitor 23. The bridge rectifying circuit 22 rectifies the alternating-current power into the direct-current power. The bridge rectifying circuit 22 has input terminals 22a and 22b respectively connected to the external input terminals 10a and 10b via power lines 30a and 30b. The smoothing capacitor 23 is provided to smooth the output direct-current power of a pulsating waveform from the bridge rectifying circuit 22, and is connected to output terminals 22c and 22d of the bridge rectifying circuit 22.

The DC-DC converter 25 includes a transformer T, a switching element Q, a secondary rectifying circuit 26, and a switching control circuit 29.

The transformer T is provided to transmit power from the primary side to the secondary side, and includes a primary coil n1 and a secondary coil n2. The primary coil n1 generates voltage from switching current to provide excitation energy to the transformer T. The secondary coil n2 generates voltage from the excitation energy generated by the primary coil n1. One of the terminals, T1, of the primary coil n1 is connected to a positive terminal 23a of the smoothing capacitor 23.

The switching, element Q is a transistor that induces a voltage in the primary coil n1 of the transformer T by switching the current flowing through the primary coil n1 of the transformer T. The switching element Q is connected between the other terminal, T2, of the primary coil n1 and a negative terminal 23b of the smoothing capacitor 23. The switching element Q, and the primary coil n1 of the transformer T constitute a series circuit that receives the primary direct-current power from the primary rectifying circuit 21.

The secondary alternating-current power output according to the generated voltage in the secondary coil n2 of the transformer T is converted into the secondary direct-current power by the secondary rectifying circuit 26. The secondary rectifying circuit 26 includes a diode 27 and a smoothing capacitor 28. The diode 27 rectifies the secondary alternating-current power to direct-current power. The anode of the diode 27 is connected to one of the terminals, T3, of the secondary coil n2. The smoothing capacitor 28 generates the secondary direct-current power by smoothing the current flowing out of the diode 27. The smoothing capacitor 28 has a positive terminal 28a connected to the cathode of the diode 27, and a negative terminal 28b connected to the other terminal, T4, of the secondary coil n2 of the transformer T. The positive terminal 28a of the smoothing capacitor 28 is the positive output terminal of the AC-DC conversion circuit 20, and the negative terminal 28b is the negative output terminal of the AC-DC conversion circuit 20. The positive terminal 28a and the negative terminal 28b are connected to the load R0 via output lines 33a and 33b, respectively. The negative terminal 28b is connected to the protective frame 100, and grounded to the chassis.

The switching control circuit 29 detects the output voltage across the output terminals (terminals 28a and 28b) of the AC-DC conversion circuit 20, and uses the detection result to control the ON/OFF of the switching element Q with a pulsed drive signal supplied to the switching element Q.

The operation of the AC-DC conversion circuit 20 is described below. First, the input primary alternating-current power between the external input terminals 10a and 10b of the power input section 10 from the alternating-current source 5 is converted into the primary direct-current power by the primary rectifying circuit 21. The converted primary direct-current power is input to the series circuit formed by the switching element Q and the primary coil n1 of the transformer T. The switching control circuit 29 then controls the ON/OFF of the switching element Q, and the secondary alternating-current power is induced in the secondary coil n2 of the transformer T. The secondary rectifying circuit 26 converts the secondary alternating-current power into the secondary direct-current power, which is then supplied to the load R0 via the output lines 33a and 33b. The switching control circuit 29 detects the output voltage across the output terminals (terminals 28a and 28b) of the AC-DC conversion circuit 20. By using the detection result, the switching control circuit 29 increases or decreases the duty of the pulse that controls the ON/OFF of the switching, element Q, and thereby varies the ON time of the switching element Q to control the output voltage.

Various elements in the AC-DC conversion circuit 20 generate noise during the operation of the AC-DC conversion circuit 20. For example, switching of the switching element Q produces switching noise on the primary side of the transformer T. The current flow through the primary rectifying circuit 21 also generates noise. On the secondary side of the transformer T, for example, the current flow through the secondary rectifying circuit 26 generates noise. The noise generated on the primary side of the transformer T transfers to the secondary side via the transformer T, and the noise generated on the secondary side of the transformer T transfers to the primary side via the transformer T. The noise on the primary side of the transformer T is undesirably conducted to the power lines 30a and 30b and leaks into the alternating-current source 5. The noise on the secondary side of the transformer T is also problematic, because it is conducted to the frame grounding wire 31 via the frame ground FG and leaks into external devices such as peripherals.

As a countermeasure, in the present embodiment, the noise reduction unit 50 reduces the noise generated in the noise source, specifically, the AC-DC conversion circuit 20, and conducted through the power lines 30a and 30b and the frame grounding wire 31. Note that the noise conducted through the power lines 30a and 30b and the noise conducted through the frame grounding wire 31 have different noise components (for example, the frequency components, and the magnitudes of the frequency components of the noise), because the circuit structures (routes) for the element (for example, the switching element Q) are different. On the other hand, the noise conducted through the power line 30a and the noise conducted through the power line 30b have essentially the same noise components, because the circuit structures for the noise generating element are essentially the same.

The noise reduction unit 50 has a chassis 85, as illustrated in FIGS. 2A and 2B. Inside the chassis 85 are disposed a common-mode filter L1, a normal-mode filter L2, a core supporting member 80, and a belt 90. The chassis 85 may be realized by, for example, the frame of the power supply device 101.

Figure 3A:
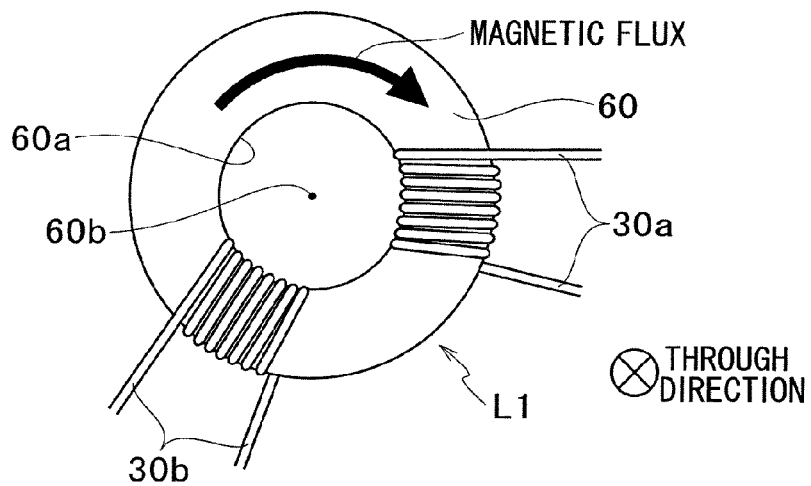
FIG. 3A is an explanatory diagram of a common-mode filter.

The common-mode filter L1 prevents the noise from leaking toward the alternating-current source 5, and, as depicted in FIG. 1, FIG. 2A, and FIG. 3A, includes a core 60 (first core), and the power lines 30a and 30b. The core 60 is a magnetic core (ferrite core) of materials such as metal oxide, and has a form of a cylinder with a through hole 60a. The power lines 30a and 30b are wound around the core 60 through the through hole 60a. The power lines 30a and 30b are wound around the core 60 in opposite directions. As described above, the noise components are essentially the same for the noise conducted in the power lines 30a and 30b, and thus the magnetic fluxes due to the noise conducted in the power lines 30a and 30b add together in the core 60 and produce a large impedance. The noise conducted in the power lines 30a and 30b can thus be reduced.

Figure 3B:
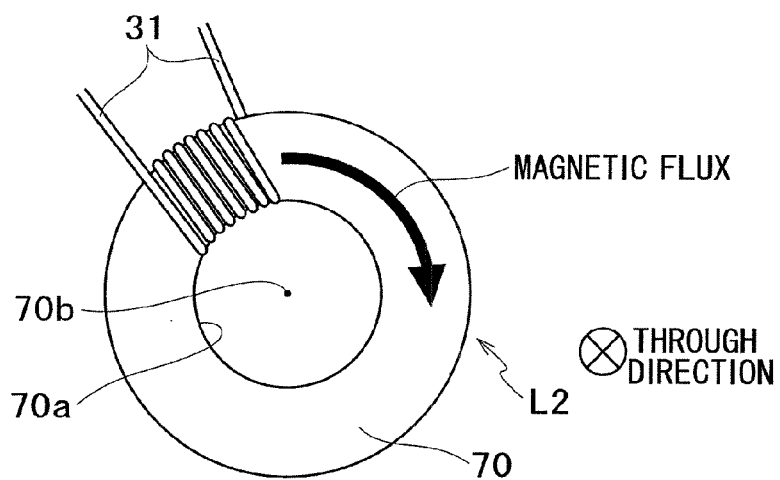
FIG. 3B is an explanatory diagram of a normal-mode filter.

The normal-mode filter L2 prevents the noise from leaking into external devices such as peripherals via the frame ground FG, and, as depicted in FIG. 2A and FIG. 3B, includes a core 70 (second core) and the frame grounding wire 31. As with the core 60, the core 70 is a magnetic core of material such as metal oxide, and has a form of a cylinder with a through hole 70a. The frame grounding wire 31 is wound around the core 70 through the through hole 70a. In this way, a magnetic flux generates inside the core 70, and an impedance is produced for the noise conducted through the frame grounding wire 31. The noise conducted through the frame grounding wire 31 can thus be reduced. In the present embodiment, the core 70 and the core 60 have the same shape.

The core supporting member 80 is cylindrical in shape, and anchors and supports the core 60 and the core 70 inside. The core supporting member 80 is an insulating heat-shrinkable tube used after being shrunk under heat.

Figure 3C:
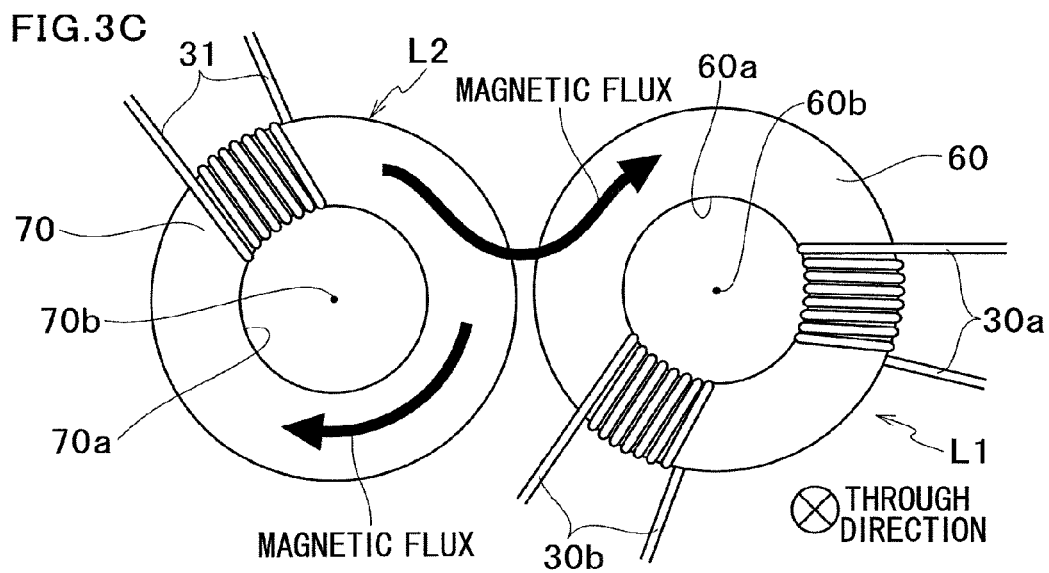
FIG. 3C is an explanatory diagram explaining a deteriorating factor of the noise reduction effect.

The core 60 and the core 70 need to be disposed close to each other in order to downsize the noise reduction unit 50. However, the noise reduction effects of the cores 60 and 70 may deteriorate in a manner that depends on the placement or positions of the cores 60 and 70. For example, as shown in FIG. 3C, the magnetic flux generated inside the core 60 or 70 interacts with the other core by magnetic coupling when the cores 60 and 70 are disposed parallel to each other along the through direction of the through holes 60a and 70a and spaced apart from each other on a plane orthogonal to the through direction. For example, a change may occur in the noise component of one of the cores when the magnetic flux flowing in the other core transfers and interacts with the magnetic flux of the core. The cores cannot accommodate such noise component changes, because the core materials and dimensions are designed in a manner that reduces the noise component of the predetermined range. This may lead to the deterioration of the noise reduction effect.

As a countermeasure, in the present embodiment, the core supporting member 80 anchors and supports the cores 60 and 70 in such a manner that the cores 60 and 70 are disposed parallel to each other along the through direction of the through holes 60a and 70a and spaced apart from each other with a predetermined gap along the through direction, as shown in FIGS. 2A and 2B. The magnetic fluxes generated in the cores 60 and 70 are therefore parallel to each other, and do not interact with each other. Because the cores 60 and 70 can be brought close to each other in this fashion without deteriorating the noise reduction effects, the noise reduction unit 50 can be downsized.

Further, in the present embodiment, the core supporting member 80 anchors and supports the cores 60 and 70 in such a manner that the centers 60b and 70b of the through holes 60a and 70a overlap as viewed from the through direction, as shown in FIG. 2B. The centers 60b and 70b also coincide with the cylinder axis of the core supporting member 80. In this way, the projected areas of the cores 60 and 70 as viewed from the through direction can be reduced, and the noise reduction unit 50 can be downsized even further.

Further, in the present embodiment, the cores 60 and 70 are disposed in such a manner that the power lines 30a and 30b wound around the core 60 do not overlap the frame grounding wire 31 wound around the core 70 as viewed, from the through direction, as shown in FIG. 2B. Further, the center of gravity combining the center of gravity of each projected area of the power lines 30a and 30b wound around the core 60 with the center of gravity of the projected area of the frame grounding wire 31 wound around the core 70 coincides with the centers 60b and 70b of the through holes 60a and 70a as viewed from the through direction. In this way, the wires wound around the cores 60 and 70 are unlikely to directly contact each other between the adjacent cores even when the cores 60 and 70 anchored and supported by the core supporting member 80 are accidentally released. In the event where the cores 60 and 70 come in direct contact with each other, there are cases where the magnetic fluxes transfer between the cores 60 and 70 and deteriorate the noise reduction effect of the noise reduction unit 50. Note that it is not necessarily required that the combined center of gravity coincides with the centers 60b and 70b of the through holes 60a and 70a as viewed from the through direction, provided that the power lines 30a and 30b wound around the core 60 do not overlap the frame grounding wire 31 wound around the core 70 as viewed from the through direction. As a variation, the cores 60 and 70 may be disposed so that the center of gravity of the projected areas of the power lines 30a and 30b wound around the core 60 coincides with the center 60b of the through hole 60a, and that the center of gravity of the projected area of the frame grounding wire 31 wound around the core 70 coincides with the center 70b of the through hole 70a as viewed from the through direction.

The belt 90 is a banding band that anchors the core supporting member 80 on the chassis 85. As illustrated in FIG. 2A, the belt 90 includes a long band portion 91, and a lock portion 92 formed at one end of the band portion 91.

The lock portion 92 has a band insertion hole and a band locking portion formed in the band insertion hole (neither is shown). An engaging portion (not shown) that engages the band locking portion in the band insertion hole is continuously formed along the longitudinal direction of the band portion 91. Inserting the band portion 91 in the band insertion hole of the lock portion 92 engages the engaging portion of the band portion 91 with the band locking portion, and restricts the movement of the band portion 91 in one direction relative to the lock portion 92. Specifically, the band portion 91 can only be moved so as to be inserted into the band insertion hole, and cannot be drawn out of the band insertion hole.

Figure 4A:
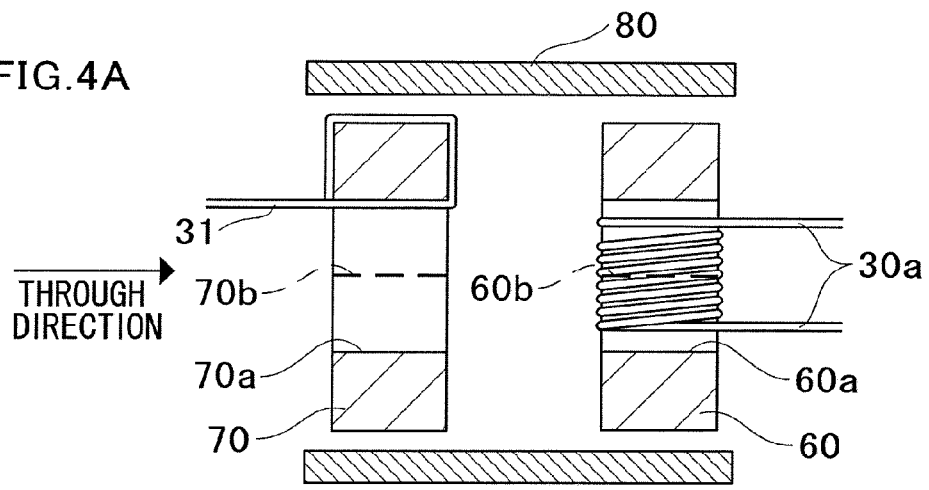
FIG. 4A is a cross sectional view taken at line A-A of FIG. 2B with the exclusion of a noise reduction unit chassis, explaining a step of supporting and anchoring cores with a core supporting member.
Figure 4B:
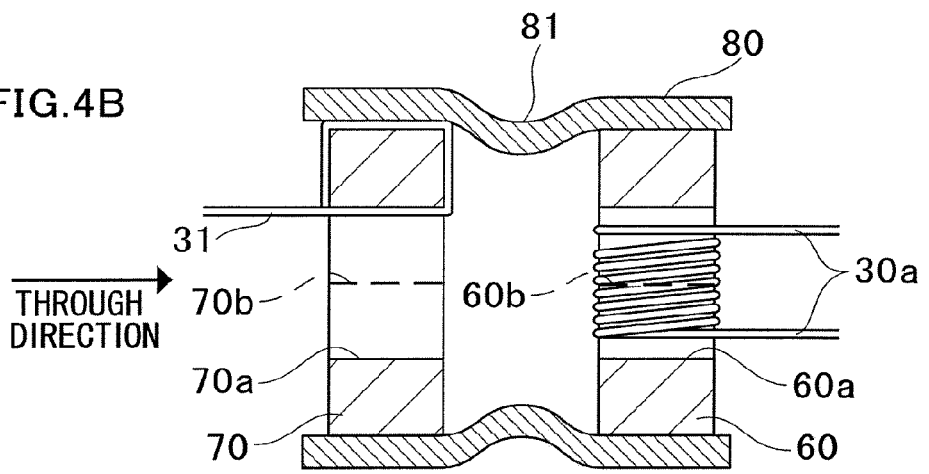
FIG. 4B is a cross sectional view taken at line A-A of FIG. 2B with the exclusion of a noise reduction unit chassis, explaining a step of supporting and anchoring cores with a core supporting member.
Figure 4C:
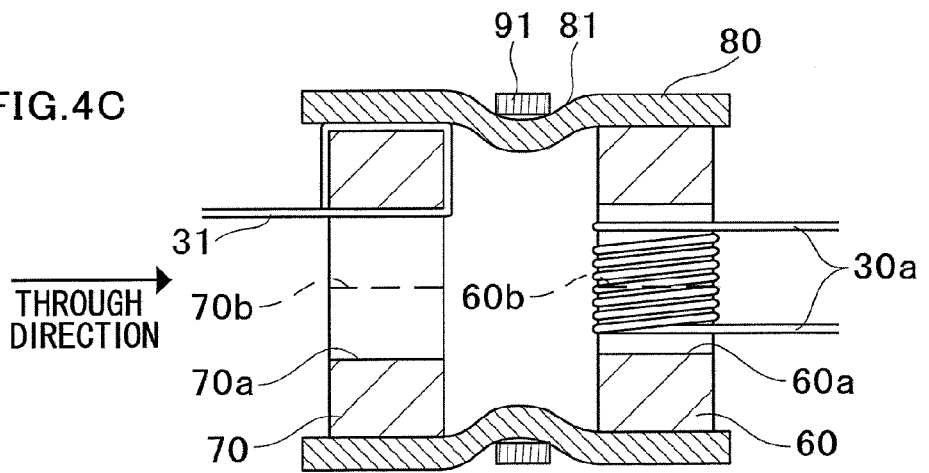
FIG. 4C is a cross sectional view taken at line A-A of FIG. 2B with the exclusion of a noise reduction unit chassis, explaining a step of anchoring the core supporting member on the chassis.

The following describes the method of anchoring the cores 60 and 70 with the core supporting member 80, and the method of anchoring the core supporting member 80 on the chassis 85 with the belt 90, with reference to FIGS. 4A to 4C.

First, as illustrated in FIG. 4A, the cores 60 and 70 are disposed in the core supporting member 80 (heat-shrinkable tube). Note that the inner diameter of the core supporting member 80 before thermal shrinkage is one size larger than the outer diameters of the cores 60 and 70.

The cores 60 and 70 are disposed in the core supporting member 80 parallel to each other along the through direction of the through holes 60a and 70a and spaced apart from each other with a predetermined gap in the through direction. Here, the centers 60b and 70b of the through holes 60a and 70a of the cores 60 and 70 overlap as viewed from the through direction, and the power lines 30a and 30b wound around the core 60 do not overlap the frame grounding wire 31 wound around the core 70 as view from the through direction.

Then, the core supporting member 80 is heated to shrink in the radial direction, as illustrated in FIG. 4B. This anchors and supports the cores 60 and 70 on the inner wall of the core supporting member 80. Here, the region of the core supporting member 80 between the cores 60 and 70 adjacent to each other in the through direction shrinks inward of the outer circumferences of the cores 60 and 70 in the radial direction under the applied heat. As a result, an annular depression 81 is formed that is depressed inwardly in the radial direction of the core supporting member 80 between the cores 60 and 70 disposed adjacent to each other in the through direction.

For anchoring the core supporting member 80 on the chassis 85 with the belt 90, as illustrated in FIG. 4C, the band portion 91 is wound around the annular depression 81 of the core supporting member 80, and the front end portion of the band portion 91 is inserted into the band insertion hole of the lock portion 92. The band portion 91 is then drawn out of the lock portion 92 and tightened, and the front end portion of the band portion 91 drawn out of the lock portion 92 is anchored on the chassis 85. Because the band portion 91 is wound around the annular depression 81 in this fashion, the belt 90 does not easily come off the core supporting member 80. This ensures that the core supporting member 80 is reliably anchored on the chassis 85.

In the present embodiment described above, the cores 60 and 70 are disposed parallel to each other along the through direction of the through holes 60a and 70a and spaced apart from each other with a predetermined gap in the through direction. Accordingly, the magnetic fluxes generated in the cores 60 and 70 are also parallel to each other, and do not interfere with each other. Because the cores 60 and 70 can be brought close to each other in this fashion without deteriorating the noise reduction effect, the noise reduction unit 50 can be downsized.

Further, in the present embodiment, because the core supporting member 80 is a heat-shrinkable member used after being shrunk under heat, the cores 60 and 70 can be anchored and supported with a simple structure.

Second Embodiment

A power supply device 201 according to Second Embodiment of the present invention is described, below with reference to FIGS. 5 and 6. Second Embodiment differs from First Embodiment in that the power supply device 201 is a multi-output power supply device provided with multiple DC-DC converters 125 and 126. Further, in Second Embodiment, common-mode filters L3 and L4 are provided the noise reduction between each output terminal of the DC-DC converters 125 and 126 and the load R0. In the following, the constituting elements and/or features already described in the foregoing First Embodiment are appended with the same reference numerals, and explanations thereof are omitted as appropriate.

Figure 5:
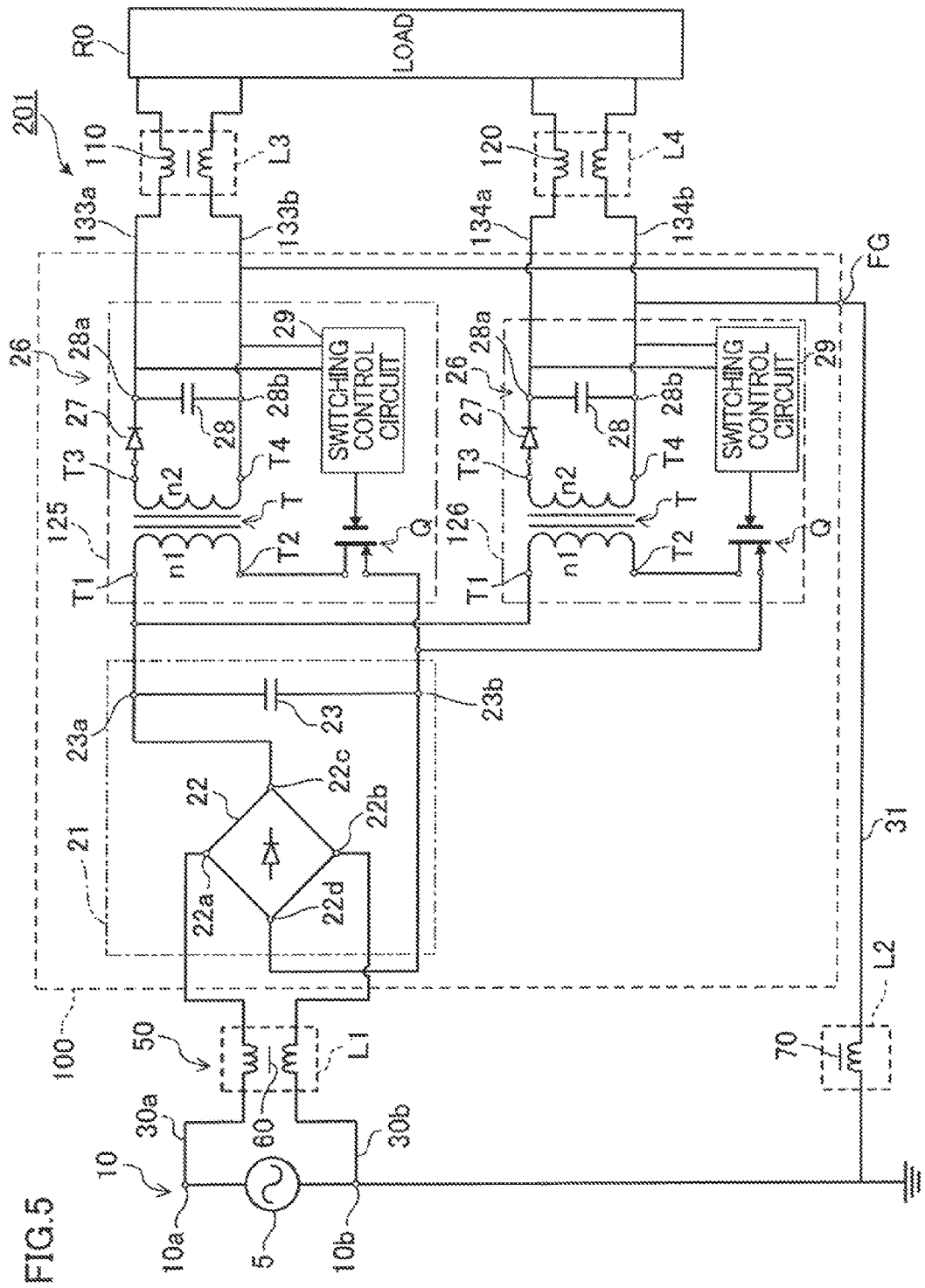
FIG. 5 is a circuit diagram of a power supply device according to Second Embodiment of the present invention.

In the present embodiment, as illustrated in FIG. 5, the DC-DC converters 125 and 126 are connected in parallel with respect to the primary rectifying circuit 21. The output voltages from the DC-DC converters 125 and 126 are different because the ON/OFF time ratio (duty ratio) of the switching element Q as determined by the switching control circuit 29 is different for the DC-DC converters 125 and 126.

The output terminals 28a and 28b of the DC-DC converter 125 are connected to the load R0 via output lines 133a and 133b. The output terminals 28a and 28b of the DC-DC converter 126 are connected to the load R0 via output lines 134a and 134b. The DC-DC converters 125 and 126 of the present embodiment correspond to power conversion circuits. Further, the output terminals of the primary rectifying circuit 21 (the positive terminal 23a and the negative terminal 23b of the smoothing capacitor 23) of the present embodiment correspond to power input terminals.

During the operation of the DC-DC converters 125 and 126, switching of the switching elements Q in the DC-DC converters 125 and 126 produces noise or other disturbances. The noise generated in the DC-DC converters 125 and 126 may undesirably leak into the load R0 through the output lines 133a, 133b, 134a, and 134b.

As described above, the ON/OFF time ratio of the switching element Q is different for the DC-DC converters 125 and 126. Accordingly, the noise component of the noise due to the switching of the switching element Q is also different for the DC-DC converters 125 and 126. The noise component is thus different for the noise conducted through the output lines 133a and 133b, and the noise conducted through the output lines 134a and 134b. Further, the noise components greatly differ for the noise conducted through the output lines 133a, 133b, 134a, and 134b, and the noise conducted through the power lines 30a and 30b and the frame grounding wire 31, because the circuit structures for the noise-producing elements are different. On the other hand, the noise conducted through the output line 133a and the noise conducted through the output line 133b have essentially the same noise components. Similarly, the noise components are essentially the same for the noise conducted through the output line 134a and the noise conducted through the output line 134b.

In the present embodiment, the noise reduction unit 150 is capable of reducing the noise conducted through the output lines 133a, 133b, 134a, and 134b, in addition to the noise conducted through the power lines 30a and 30b and the frame grounding wire 31. Specifically, the noise reduction unit 150 includes a common-mode filter L3 and a common-mode filter L4, in addition to the common-mode filter L1 and the normal-mode filter L2.

Figure 6:
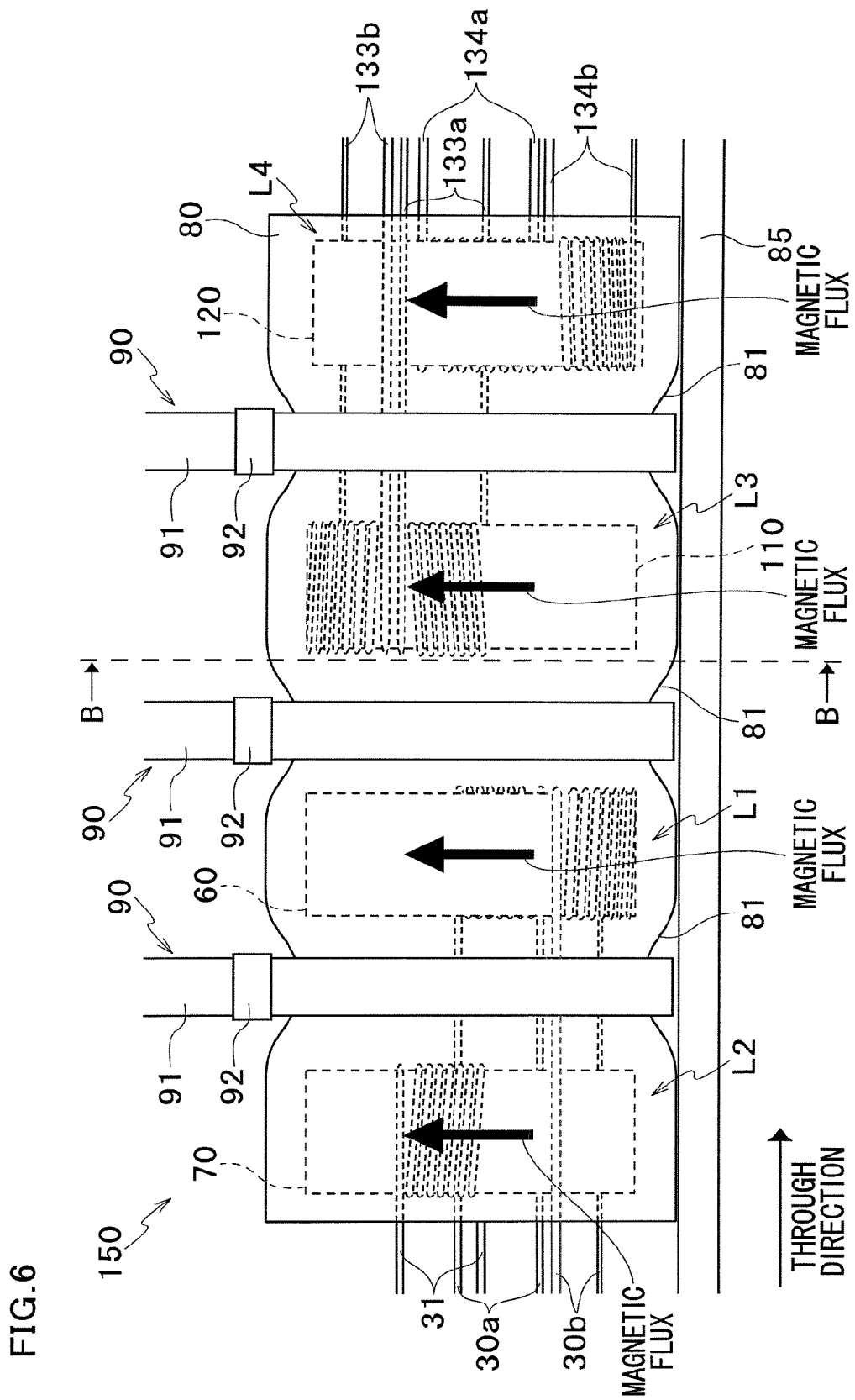
FIG. 6 is a side view of the noise reduction unit of FIG. 5 as viewed from a direction orthogonal to the through direction of through holes of cores.
Figure 7:
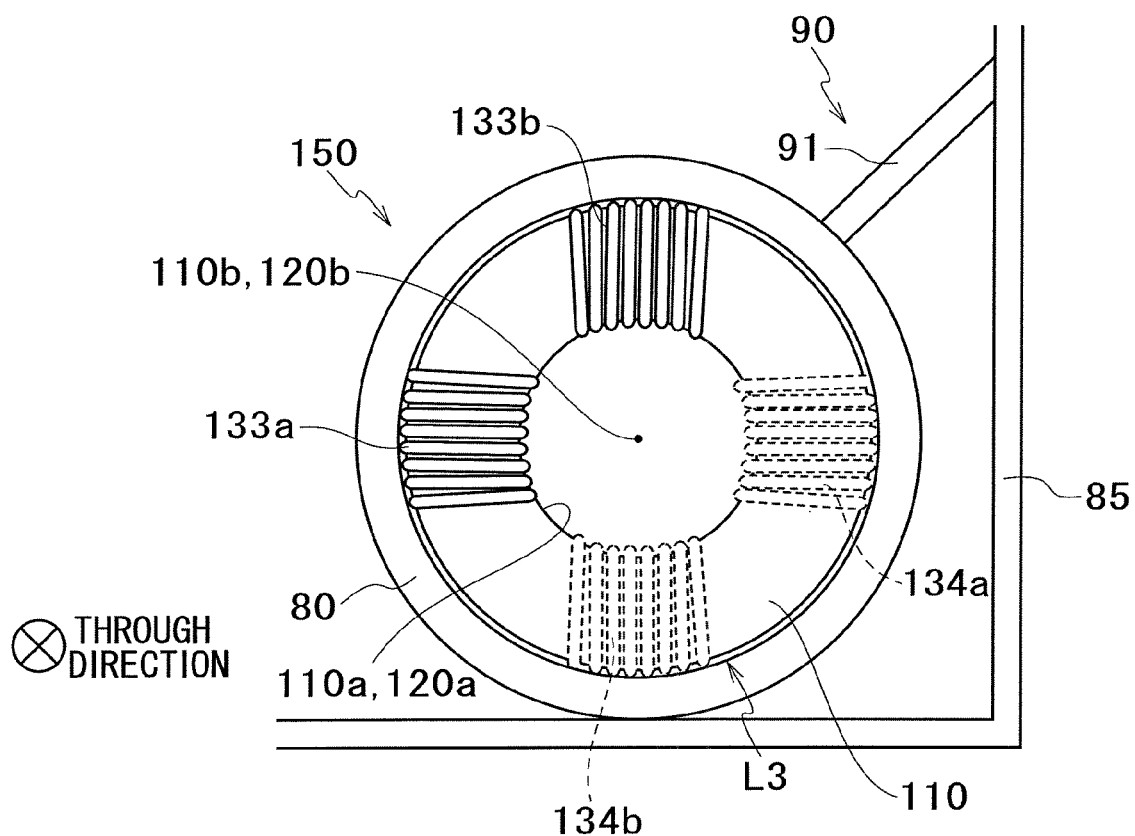
FIG. 7 is a cross sectional view taken at line B-B of FIG. 6.

The common-mode filter L3 prevents the generated noise in the DC-DC converter 125 from leaking toward the load R0, and, as illustrated in FIGS. 5 and 6, includes a core 110 and the output lines 133a and 133b. The core 110 is a magnetic core of material such as metal oxide, and has a form of a cylinder with a through hole (not illustrated). The output lines 133a and 133b are wound around the core 110 through the through hole. The output lines 1.33a and 133b are wound around the core 110 in opposite directions. As described above, the noise components are essentially the same for the noise conducted through the output lines 133a and 133b, and thus the magnetic fluxes due to the noise conducted in the output lines 133a and 133b add together in the core 110 and produce a large impedance. The noise conducted in the output lines 133a and 133b can thus be reduced.

The common-mode filter L4 prevents the generated noise in the DC-DC converter 126 from flowing toward the load R0, and, as illustrated in FIGS. 5 and 6, includes a core 120 and the output lines 134a and 134b. The core 120 and the output lines 134a and 134b will not be described, because these are the counterparts of the core 110 and the output lines 133a and 133b. In the present embodiment, the cores 60, 70, 110, and 120 have the same shape.

The core supporting member 80 anchors and supports the cores 110 and 120, in addition to the cores 60 and 70. As illustrated in FIG. 6, the core supporting member 80 anchors and supports the cores 60, 70, 110, and 120 in such a manner that the cores 60, 70, 110, and 120 are parallel to one another along the through direction of the through holes 60a, 70a, 110a, and 120a and spaced apart from one another with predetermined gaps in the through direction. Accordingly the magnetic fluxes generated in the cores 60, 70, 110, and 120 are parallel to one another, and do not interfere with one another. Because the cores 60, 70, 110, and 120 can be brought close to one another in this fashion without deteriorating the noise reduction effect, the noise reduction unit 150 can be downsized.

Further, as illustrated in FIG. 6, the core supporting member 80 anchors and supports the cores 110 and 120 so that the centers 110b and 120b of the through holes 11.0a and 120a overlap as viewed from the through direction. Here, the output lines 133a and 133b wound around the core 110 do not overlap the output lines 134a and 134b wound around the core 120 as viewed from the through direction. Further, the output lines 133a and 133b wound around the core 110 do not overlap the power lines 30a and 30b wound around the core 60 adjacent to the core 110, as viewed from the through direction. In this way, the wires wound around the cores 60, 70, 110, and 120 are unlikely to directly contact one another between the adjacent cores even when the cores 60, 70, 110, and 120 anchored and supported by the core supporting member 80 are accidentally released.

As described above, in the present embodiment, the noise conducted through the output lines 133a, 133b, 134a, and 134b can be reduced with the common-mode filters L3 and L4. Further, the magnetic fluxes generated in the cores 60, 70, 110, and 120 are parallel to one another, and do not interfere with one another, because the cores 60, 70, 110, and 120 are disposed parallel to one another along the through direction of the through holes 60a, 70a, 110a, and 120a and spaced apart from one another with predetermined gaps in the through direction. Because the cores 60, 70, 110, and 120 can be brought close to one another in this fashion without deteriorating the noise reduction effect, the noise reduction unit 150 can be downsized.

The core shape, described as being cylindrical in the foregoing embodiments, is not particularly limited. For example, the core may be a cuboid with a through hole. Further, the core, described in the foregoing embodiments as having an annular shape as viewed from the through direction of the through hole, may have the shape of the letter C. In other words, a slit may be formed along the through direction.

Further, even though the foregoing embodiments were described through the case where the core supporting member is an insulating heat-shrinkable tube used after being shrunk under heat, the core supporting member is not particularly limited as long as it is an insulator capable of anchoring and supporting the plurality of cores disposed parallel to one another along the through direction of the through holes and spaced apart from one another with predetermined gaps in the through direction. A variation of the core supporting member is described below with reference to FIGS. 8A and 8B.

Figure 8A:
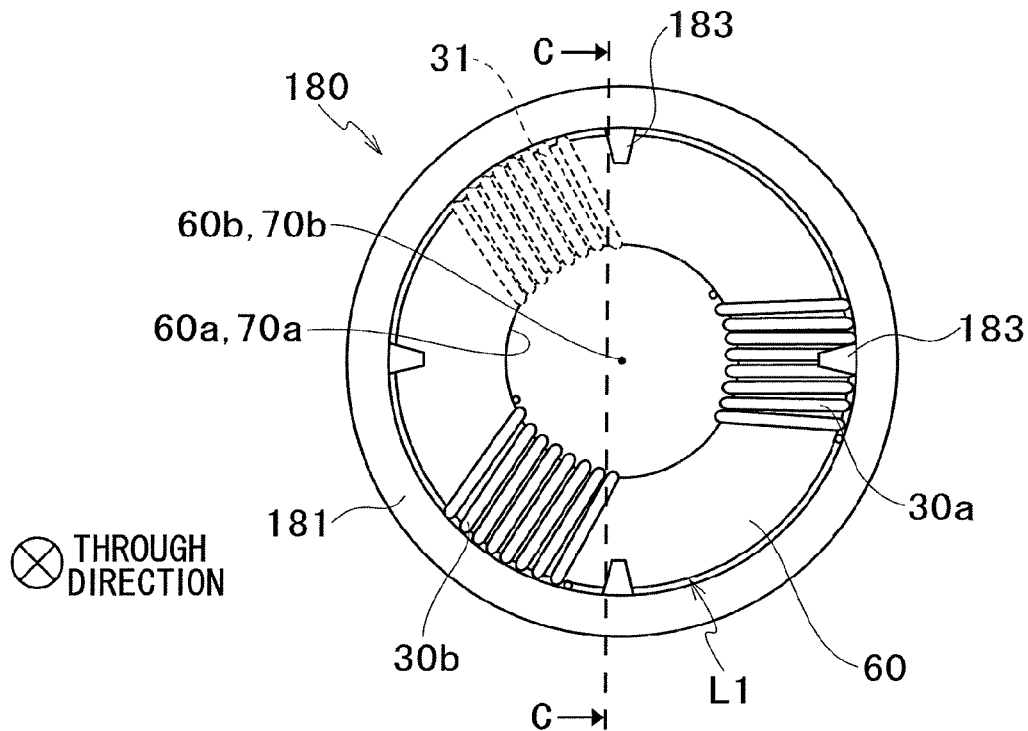
FIG. 8A is explanatory plan view explaining a variation of the core supporting member as viewed from the through direction of the through holes of the cores.
Figure 8B:
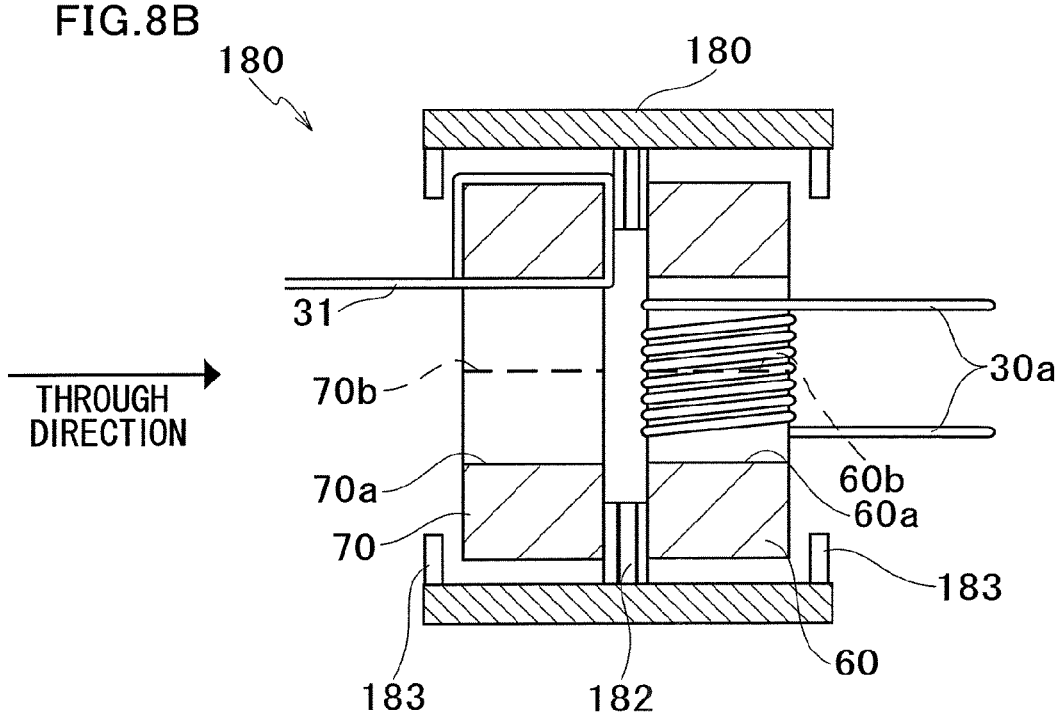
FIG. 8B is a cross sectional view taken at line C-C of FIG. 8A.

As illustrated in FIGS. 8A and 8B, a core supporting member 180 according a variation of the invention includes an annular member 181, a step portion 182, and a plurality of projecting portions 183. The annular member 181 is cylindrical in shape, and has an inner diameter slightly larger than the outer diameter of the core. With the core housed inside, the annular member 181 can restrict the core movement in the radial direction.

The step portion 182 radially projects out of the center of the inner wall relative to the cylinder axis direction of the annular member 181. The projecting portions 183 radially project out of the inner wall at the both ends relative to the cylinder axis direction of the annular member 181, and are spaced apart from one another with predetermined gaps along the circumferential direction of the annular member 181. The core housed inside the annular member 181 can thus be restricted from moving in the cylinder axis direction by the step portion 182 and the projecting portions 183 formed at one end of the cylinder axis direction. The annular member 181, the step portion 182, and the projecting portions 183 anchor and support the core in this fashion.

The projecting portions 183 are flexible, and bend when the force applied in the cylinder axis direction exceeds a predetermined value. In order to house the core in the annular member 181, the core is pushed into the annular member 181 from one end of the annular member 181 in the cylinder axis direction with a force exceeding a predetermined value. The force applied to the core bends the projecting portions 183, and the core is housed inside the annular member 181.

In the foregoing embodiments, the plurality of cores (60 and 70, or 110 and 120) is disposed so as to overlap each other as viewed from the through direction. However, this is not necessarily required as long as the plurality of cores is disposed parallel to each other along the through direction of the through holes and spaced apart from each other with a predetermined gap in the through direction. That is, the plurality of cores (60 and 70, or 110 and 120) may be disposed so as not to overlap each other as viewed from the through direction. The noise reduction unit can also be downsized in the through direction, because the magnetic flux flowing in one of the cores does not interfere with the other core.

The shapes of the plurality of cores (60 and 70, or 110 and 120), described as being the same in the foregoing embodiments, may be different from each other.

Further, in the foregoing First Embodiment, the core supporting member 80 anchors and supports the cores 60 and 70 in such a manner that the centers 60b and 70b of the through holes 60a and 70a overlap each other as viewed from the through direction. However, the centers 60b and 70b of the through holes 60a and 70a are not necessarily required to overlap each other as viewed from the through direction, as long as the cores 60 and 70 are anchored and supported with through holes 60a and 70a at least partially overlapping each other as viewed from the through direction.

The present invention is not limited to the foregoing embodiments, and is also applicable to various types of noise reduction units in which the noise component of the Boise conducted through each wire from a noise source is different for each of the cores wound with a plurality of wires.

While this invention has been described in conjunction with the specific embodiments outlined above, it is evident that many alternatives, modifications and variations will be apparent to those skilled in the art. Accordingly, the preferred embodiments of the invention as set forth above are intended to be illustrative, not limiting. Various changes may be made without departing from the spirit and scope of the invention as defined in the following claims.

What is claimed is:

1. A noise reduction unit comprising:
 a plurality of cores each having formed therein a through hole;
 a plurality of wires connected to a noise source and each wound around the corresponding core of the plurality of cores through the through hole of the corresponding core; and
 a core supporting member that supports the plurality of cores,
 wherein the core supporting member supports the plurality of cores such that the plurality of cores is disposed parallel to each other along a through direction of the each through hole formed in the plurality of cores and spaced apart from each other with a predetermined gap in the through direction,
 wherein the core supporting member is a heat-shrinkable tube, and
 wherein the plurality of cores is supported in the heat-shrinkable tube by shrinking the heat-shrinkable tube under heat after disposing the plurality of cores in the heat-shrinkable tube.

2. The noise reduction unit according to claim 1, wherein the noise source is configured to conduct noise through each of the plurality of wires, the noise having a noise component that differs for each of the plurality of cores wound with the plurality of wires.

3. The noise reduction unit according to claim 1, wherein the plurality of cores is disposed such that the through holes of the plurality of cores at least partially overlap each other in the through direction.

4. The noise reduction unit according to claim 3, wherein the plurality of cores is disposed such that there is no overlap between the wires of the plurality of wires wound around adjacent cores of the plurality of cores that are disposed adjacent to each other in the through direction.

5. The noise reduction unit according to claim 1, further comprising:
 a chassis; and
 a belt that anchors the core supporting member on the chassis,
 wherein the core supporting member has an annular depression depressed inwardly in a radial direction of the heat-shrinkable tube between the cores adjacently disposed in the through direction, the annular depression being formed upon shrinking the heat-shrinkable tube under heat, and
 wherein the belt is wound around the annular depression.

6. A power supply device configured to supply an externally input power to a load with the noise reduction unit of claim 1,
 the power supply device comprising:
 a plurality of power input terminals configured to receive the externally input power;
 a plurality of power conversion circuits connected in parallel with respect to the plurality of power input terminals, and configured to convert the externally input power through the plurality of power input terminals into different predetermined powers; and
 a plurality of output lines configured to connect a plurality of output terminals of the plurality of power conversion circuits to the load,
 the noise source being the plurality of power conversion circuits, and
 the plurality of output lines being used as the wires of the plurality of wires of the noise reduction unit and wound around different cores of the plurality of cores.

7. The power supply device according to claim 6,
 wherein the externally input power through the plurality of power input terminals is a primary direct-current power, and
 wherein the plurality of power conversion circuits is a plurality of DC-DC converters configured to convert the primary direct-current power into a secondary direct-current power, the plurality of DC-DC converters each including:
- a series circuit configured to receive the primary direct-current power, and includes a switching element and a primary coil provided in a transformer;
- a switching control circuit configured to control switching of the switching element; and
- a secondary rectifying circuit configured to produce the secondary direct-current power by conversion from a secondary alternating-current power induced in a secondary coil of the transformer in response to the switching of the switching element by the switching control circuit.

8. A power supply device comprising:
a noise reduction unit;
a plurality of power input terminals configured to receive an externally input power;
a power conversion circuit configured to convert the input power through the plurality of power input terminals into a converted predetermined power, and configured to output the converted predetermined power;
a plurality of power lines that connects the plurality of power input terminals to a plurality of input terminals of the power conversion circuit; and
a frame grounding wire that connects a ground terminal in the plurality of power input terminals to a frame configured to protect the power conversion circuit,
the noise reduction unit including:
- a plurality of cores each having formed therein a through hole;
- a plurality of wires connected to a noise source and each wound around the corresponding core of the plurality of cores through the through hole of the corresponding core; and
- a core supporting member that supports the plurality of cores, wherein the core supporting member supports the plurality of cores such that the plurality of cores is disposed parallel to each other along a through direction of each through hole formed in the plurality of cores and spaced apart from each other with a predetermined gap in the through direction, wherein the noise source is the power conversion circuit, wherein at least one of the plurality of power lines is used as the wires of the plurality of wires of the noise reduction unit and wound around at least one first core selected from the plurality of cores, and wherein the frame grounding wire is used as one of the wires of the plurality of wires of the noise reduction unit and wound around at least one second core different from the first core and selected from the plurality of cores.

9. The power supply device according to claim 8,
wherein the externally input power to the plurality of power input terminals is an alternating-current power, and
wherein the power conversion circuit includes:
- a primary rectifying circuit configured to convert the input alternating-current power through the plurality of power input terminals into a primary direct-current power; and
- a DC-DC converter configured to convert the primary direct-current power into a secondary direct-current power, the DC-DC converter including:
- a series circuit configured to receive the primary direct-current power, and includes a switching element and a primary coil provided in a transformer;
- a switching control circuit configured to control switching of the switching element; and
- a secondary rectifying circuit configured to produce the secondary direct-current power by conversion from a secondary alternating-current power induced in a secondary coil of the transformer in response to the switching of the switching element by the switching control circuit.

10. The power supply device according to claim 8, wherein the noise source is configured to conduct noise through each of the plurality of wires, the noise having a noise component that differs for each of the plurality of cores wound with the plurality of wires.

* * * * *